(12) United States Patent
Li (10) Patent No.: US 8,749,408 B1
(45) Date of Patent: Jun. 10, 2014

(54) METHODS FOR SIMPLIFIED MMI VQ BASED HARQ BUFFER REDUCTION FOR LTE

(71) Applicant: MEDIATEK Singapore Pte Ltd., Singapore (SG)

(72) Inventor: Junqiang Li, Irvine, CA (US)

(73) Assignee: MEDIATEK Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/729,016

(22) Filed: Dec. 27, 2012

(51) Int. Cl.
| | |
|---|---|
| H03M 7/30 | (2006.01) |
| H04B 1/707 | (2011.01) |
| H04W 36/30 | (2009.01) |
| H04W 28/04 | (2009.01) |
| H04L 12/56 | (2006.01) |
| G06T 9/00 | (2006.01) |
| H04N 7/30 | (2006.01) |
| H04N 7/50 | (2006.01) |
| G06K 9/62 | (2006.01) |
| H04L 27/26 | (2006.01) |
| H04B 3/32 | (2006.01) |

(52) U.S. Cl.
CPC ............. *H03M 7/30* (2013.01); *H04B 1/707* (2013.01); *H04W 36/30* (2013.01); *H04W 28/04* (2013.01); *H04L 47/10* (2013.01); *G06T 9/008* (2013.01); *H04N 7/30* (2013.01); *H04N 7/50* (2013.01); *G06K 9/6218* (2013.01); *H04L 27/2647* (2013.01); *H04B 3/32* (2013.01)
USPC ............................................ 341/87; 370/335

(58) Field of Classification Search
CPC ........... H03M 7/30; H04B 1/707; H04B 3/32; H04W 36/30; H04W 28/04; H04L 47/10; H04L 27/2647; G06T 9/008; H04N 7/30; H04N 7/50; G06K 9/6218

USPC .................. 341/87; 370/335, 332, 329, 252; 382/253, 248, 232, 225; 375/260, 285
See application file for complete search history.

(56) References Cited

U.S. PATENT DOCUMENTS 6,724,940 B1 *  4/2004  Qian et al. ..................... 382/253

OTHER PUBLICATIONS

"Maximum mutual information vector quantization of log-likelihood ratios for memory efficient HARQ implementations", M. Danieli etc., Nokia Denmark, 2010 data compression conference.
"Quantization of log-likelihood ratios to Maximize mutual information", Wolfgang Rave, Vodafone chair mobile communication systems, Germany.
"Minimum cross-entropy pattern classification and cluster analysis", John E Shore etc., IEEE transaction on pattern analysis and machine intelligence, Jan. 1982.
"Convergence behavior of iteratively decoded parallel concatenated codes", Stephan, IEEE transaction on Communications, p. 1727-1737, Oct. 2001.

* cited by examiner

*Primary Examiner* — Joseph Lauture
(74) *Attorney, Agent, or Firm* — Zheng Jin; Helen Mao (57) ABSTRACT

Methods of simplified MMI VQ based HARQ buffer reduction are disclosed. In one embodiment of the invention, the VQ obtains distribution information from source data based on a predefined codebook subset design. The subset design is predefined. Source data is trained within its corresponding subset to generate codebook. In one embodiment of the invention, the predefined subset algorithm is based on the LLR sign value. In another embodiment of the invention, source data is divided into subset based on predefined algorithm. The index to codebook is generated by search through the corresponding subset of the codebook instead of the whole codebook. In one embodiment of the invention, the training method is a modified Lloyd algorithm for MMI VQ. In another embodiment of the invention, the training method is a modified Lloyd algorithm for Euclidean distance VQ.

20 Claims, 9 Drawing Sheets

GENERIC MODIFIED LLOYD ALGORITHM

CODE BOOK ENCODING/DECODING

FIG. 3

FIG. 4
VQ CODEBOOK DESIGN

FIG. 5A

VQ FOR DATA BLOCKS USING GENERATED CODEBOOK

| 0 | + | - | | | - |
|---|---|---|---|---|---|
| 0 | 0 | 0 | | | - |
| 0 | 0 | 0 | | | - |
| 0 | 1 | 2 | 3 | 25 | 26 |

SIGN LABEL BASED CB CLASSIFICATION

FIG. 5B

GENERIC MODIFIED LLOYD ALGORITHM

MODIFIED LLOYD ALGORITHM FOR EUCLIDEAN
DISTANCE VQ

FIG. 8

SIZE 6020 SOURCE DATA SAMPLE DISTRIBUTION

FIG. 9A

SIZE 512 CODEBOOK SAMPLE DISTRIBUTION

FIG. 9B

METHODS FOR SIMPLIFIED MMI VQ BASED HARQ BUFFER REDUCTION FOR LTE

TECHNICAL FIELD

The disclosed embodiments relate generally to mobile communication networks, and, more particularly, to a simplified MMI VQ based HARQ buffer reduction.

BACKGROUND

Long Term Evolution (LTE) system is a modern mobile communication standard designed to provide seamless internet protocol (IP) connectivity between user equipment (UE) and a package data network (PDN). LTE system uses Hybrid Automatic Repeat Request (HARQ) in an effort to guarantee transmission reliability and to increase channel throughput. HARQ is a stop-and-wait scheme, where subsequent transmission can take place only after receiving ACK/NACK from the receiving entity. At the receiver side, the received information is stored temporarily on HARQ memory. If the received message is not decoded correctly, the valuable stored information can be combined with subsequent information of the same message to correctly decode the message. With the ever-increasing data rates in the mobile network, the amount of data to be stored in an receiving HARQ queue increases dramatically. For example, a category-four HARQ requires approximately 11 mega bits of external memory and 1.4 mega bits of internal memory for storing one HARQ copy. To mitigate the demand for increasing HARQ memory size, data compression at the receiving HARQ queue is needed.

Vector Quantization (VQ) is an efficient data compression method based on the principal of block coding. A VQ maps k-dimensional vectors in the vector space into a finite set of vector called a codeword. The set of all the codeword is a codebook. The VQ takes a source data vector and associates it with a codeword that is the nearest neighbor. When using VQ to compress the HARQ data, some special feature of the HARQ data should be considered. HARQ is a powerful combination of forward error correction (FEC), error detection and retransmission scheme. To maximize the performance of the error correction coding, posterior probabilities of the bits that were transmitted need to be stored while waiting for the next retransmission, usually in the form of log-likelihood ratio (LLR). One of the common compression scheme is Maximum Mutual Information (MMI) based VQ for LLR. The criterion is to maximize the mutual information between the original bits and the quantized LLR.

There are two issues associated with the VQ design for HARQ data. The first is how to generate a codebook efficiently. The second is how to optimize an MMI scheme for VQ. In a simple VQ design, a code vector is partitioned into a codeword in a codebook. Instead of storing the code vector itself, an index to the code vector is stored. Upon decompressing, the index is used to retrieve the codeword which is a close proximate to the code vector. A simple VQ method requires an exhaustive search of the codebook for each data vector. Such process is computationally expensive. A more efficient way is required for real time HARQ VQ design.

One problem is how to generate a codebook efficiently. The classical generalized Lloyd algorithm (GLA) is the most cited and widely used VQ method due to its simplicity and relatively good fidelity. However, it requires much higher processing resource. To apply GLA, a distance is defined in $R^K$, where K>1. GLA consists of two-step iterations. In the first step, the training points are associated with the closest points in the codebook based on selected distance measure, called nearest neighbor condition. In the second step, the centroids of each set of training points are selected as the new reconstruction value, called centroids condition. The algorithm can start with an initial codebook provided by other algorithm, or simply taken randomly from the training set. To calculate the distance, GLA usually is applied in conjunction with Euclidean distance, which results in minimization of the mean squared error (MSE). It is also easily applicable to use other distance measure for GLA, such as the MMI approach. In either classical GLA or some proposed modified Lloyd algorithm, problems exist for not being efficient in codebook generation or require extra buffer/memory space for implementation.

Another problem is how to optimize an MMI scheme for VQ. The limitation of traditional VQ algorithm demands high processing power and memory space. Assume a random vector $l=\{l_1, \ldots, l_k\}$. To design an optimal codebook, we draw $n_\tau$ samples of l as training points, which we can model with a random vector, $t=\{t_1, \ldots, t_K\}$, with values in an alphabet $\Gamma=\{1, \ldots, N\}$, where N is the number of cells of the VQ. For HARQ with LLR, assume $x_k$ is the original bit and $y_k$ is the reconstruction value for its LLR. I(.;.) is the mutual information between random variables, H(.) is the entropy and H(.|.) is the conditional entropy of a random variable given that another is observed. To maximize the mutual information between the original bits and the quantized LLR, the VQ needs to ensure minimize the mutual information loss $\Delta I=H(X_k|Y_k)-H(X_k|L_k)$. Further, the probability that an input point falls in region $R_i$ is defined as: $p(i)=n_i/n_\Gamma$, where $n_i=|\{t\in R_i\}|$, which is the probability of a given quantizer out is approximated by the relative number of training points that fall in the region associated with the output value i. The posterior $p(x_k|i)$, which is the average posterior probability for the original bit conditioned on the training points belonging to $R_i$, can be obtained by: $p(x_k|i)=(n_i/n_\Gamma) \Sigma_{i\in R_i} p(x_k|y_k)$. The quantized version of LLR can be represented by the index associated with the vector quantizer output and the conditional entropy satisfies: $H(X_k|I_t)=-\Sigma_{x_k\in\{0,1\}}\Sigma_{i=1}^N p(x_k|i)\log_2 p(x_k|i)$. The final expression for mutual information loss $\Delta I=(1/n_\Gamma) \Sigma_{t\in\Gamma} D_{KL}(p_{x_k|t}||q_{x_k|t})$, where $D_{KL}(p||q)$ is the KL divergence between probability distributions p and q, defined on random variables which share the same alphabet. Applying this algorithm to implement a MMI VQ requires extra buffer space and may introduce big distortion. It is not an efficient codebook design. An optimized VQ algorithm is disclosed in this invention to make the codebook design more efficient.

SUMMARY

Methods of simplified MMI VQ based HARQ buffer reduction are disclosed. In one embodiment of the invention, the VQ obtains distribution information from source data based on a predefined codebook subset design. The subset design is predefined. Subsequently, sample source data is counted into each subset according to the algorithm. Source data is trained within its corresponding subset to generate a codebook. In one embodiment of the invention, the predefined subset algorithm is based LLR sign value, and divides the data into 27 subgroups. In another embodiment of the invention, source data is divided into subset based on a predefined algorithm. The index to the codebook is generated by search through the corresponding subset of the codebook instead of the whole codebook. In one embodiment of the invention, the training method is a modified Lloyd algorithm of MMI VQ. In another embodiment of the invention, the training method is a modified Lloyd algorithm based Euclidean distance VQ.

DETAILED DESCRIPTION

Reference will now be made in detail to some embodiments of the invention, examples of which are illustrated in the accompanying drawings.

Figure 1A:
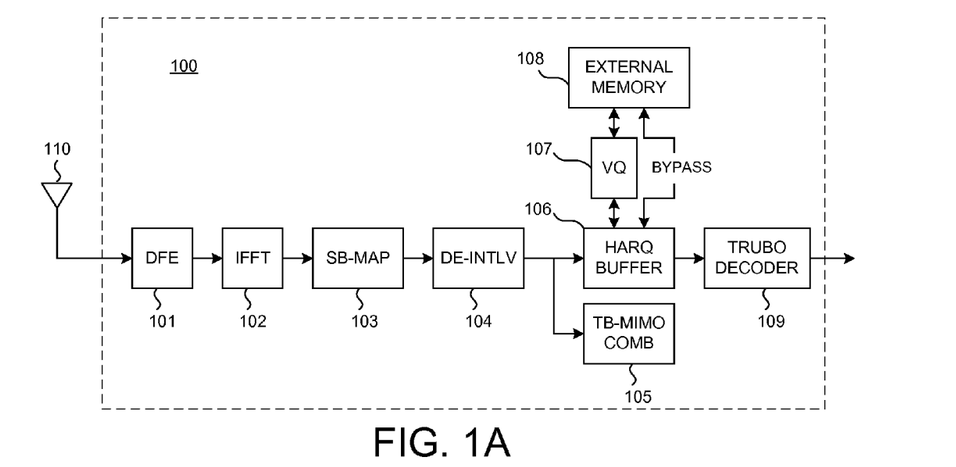
FIG. 1A schematically shows functional blocks of a UE in accordance with embodiments of the invention.

FIG. 1A schematically shows functional blocks of a user equipment (UE) in accordance with embodiments of the invention. The functional blocks reside in a receiver 100 of the UE to process radio frequency (RF) signals. A Digital Frontend (DFE) module 101 receives and processes RF signals from an antenna 110. The output of DFE 101 feeds into an Inverse Fast Fourier Transform (IFFT) module 102. IFFT 102 removes the cyclic prefix and converts the data from frequency domain to time domain. The converted data goes to a symbol de-mapper (SB-MAP) module 103 that de-maps received transmission symbols into bit stream. At channel de-interleaver (DE-INTLV) module 104, the bit stream is de-interleaved and fed into Turbo MIMO combination 105 and HARQ buffer 106. The HARQ LLR data is stored in external memory 108. Before storing the data, VQ 107 can compress the data so that reducing the external memory size. Alternatively, data can bypass VQ and directly stored in External Memory 108. When the data is correctly decoded, it is sent to turbo decoder module 109 to be decoded and forwarded to the next stage. The different modules of the UE receiver 100 are functional modules that may be implemented by software, firmware, hardware, or any combination thereof.

Figure 1B:
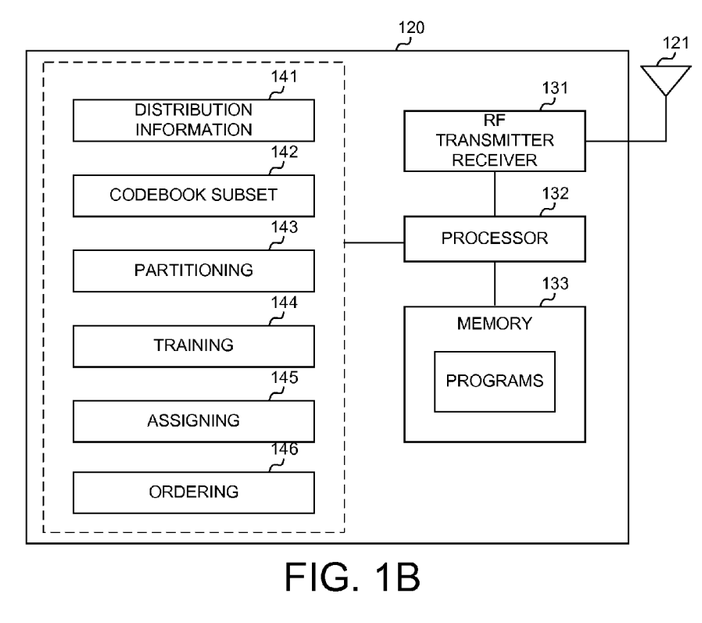
FIG. 1B shows a block diagram of a mobile device and its different function modules in accordance with embodiments of the invention.

FIG. 1B shows an exemplary block diagram of mobile device 120 that supports some embodiments of the present invention. Antenna 121 transmits and receives RF signals. RF transceiver module 131, coupled with antenna 121, receives RF signals from antenna 121, converts them to baseband signals and sends them to processor 132. RF transceiver 131 also converts received baseband signals from the processor 132, converts them to RF signals, and sends out to antenna 121. Processor 132 processes the received baseband signals and invokes different functional modules to perform features in mobile device 120. Memory 133 stores program instructions and data to control the operations of mobile device 120.

FIG. 1B also shows five functional modules 141, 142, 143, 144, 145, and 146, which carry out embodiments of the present invention. Distribution information module 141 receives source data vectors and obtains the source data distribution information based on a predefined codebook subset design. The distribution information is passed to codebook subset module 142. Codebook subset module 142 determines codebook item number $N_S$ for each codebook subset based on a predefined codebook length L and the received distribution information. Partitioning module 143 takes the source data vectors and partition them into their corresponding subset according to the predefined subset design algorithm. The partitioned source data vectors are trained by training module 144. Training module 144 applies a predefined training algorithm and trains each source data vector subset using the predefined training algorithm. Assigning module 145 assigns a default codeword for each subset that does not contain a source data vector. Ordering module 146 orders the trained codebook of each subset to a final codebook with length L.

Figure 2A:
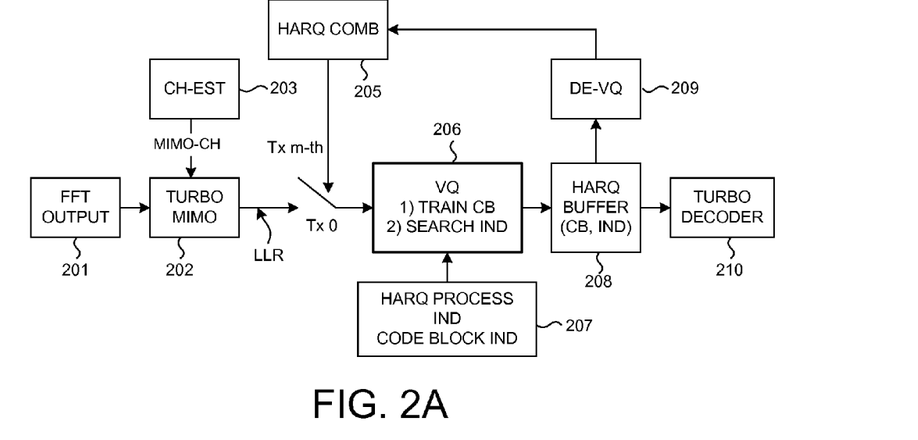
FIG. 2A schematically shows a block diagram of HARQ with VQ operation in accordance with embodiments of the invention.

FIG. 2A schematically shows a block diagram of HARQ with VQ operation in accordance with embodiments of the invention. Fast Fourier Transformation (FFT) output module 201 converts the received data, and sends it to Turbo MIMO 202. Turbo MIMO 202 takes the source data and MIMO Channel from Channel Estimator 203, generates LLR codes, and sends it to de-rate matching module 204. If this is a first transmission of data (e.g., Tx 0), then the LLR codes are output to VQ 206 for data compression. VQ 206 gets HARQ Process indicator and code block index from module 207, trains the received data and searches for codebook index. The compressed data is then forwarded to HARQ buffer 208 with codebook index for the data. On the other hand, if this is a retransmission of data (e.g., Tx m-th), HARQ combination module 205 outputs data to VQ 206 for data compression. The HARQ Buffer 208 sends the compressed data to de-VQ module 209 so that it can be de-compressed and used in HARQ combination module 205. Upon successful transmission, HARQ Buffer 208 forwards its data to Turbo Decoder 210 for data decoding.

In accordance to embodiments of the invention, VQ 206 can use modified Lloyd algorithm to reduce the amount of HARQ buffer size required. In other embodiments of the invention, VQ 206 can train codebook and search index in a predefined subset instead of doing a complete set search. Such steps increase the efficiency of VQ 206. Similar methods are applied to Turbo MIMO and HARQ combination design as shown below in FIG. 2B.

Figure 2B:
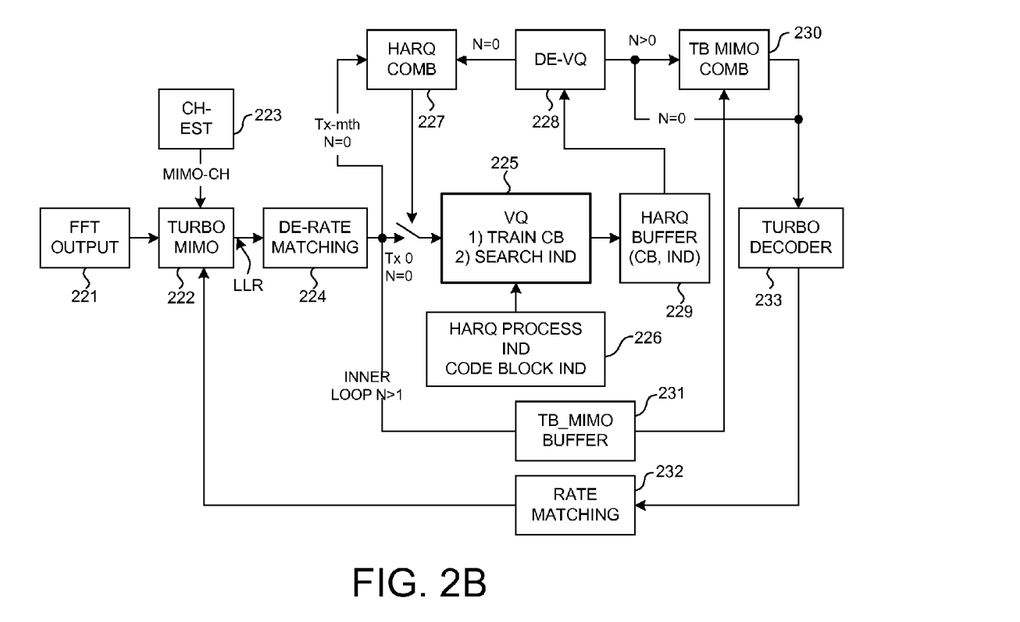
FIG. 2B schematically shows a block diagram of Turbo Multiple Input Multiple Output (MIMO) and HARQ combination with VQ operation in accordance with embodiments of the invention.

FIG. 2B schematically shows a block diagram of Turbo MIMO and HARQ combination with VQ operation in accordance with embodiments of the invention. This method contains two combinations—an HARQ combination, and a Turbo MIMO combination. The HARQ combination is similar to what is illustrated in FIG. 2A. Fast Fourier Transformation (FFT) output module 221 converts the received data, and sends it to Turbo MIMO 222. Turbo MIMO 222 takes the source data, MIMO Channel from Channel Estimator 223, and feedback data from rate matching module 232 (for improved performance), then generates LLR codes and sends them to de-rate matching module 224. If this is a first transmission of data (e.g., Tx 0), then de-rate matching module 224 outputs data to VQ 225 for data compression. VQ 225 takes HARQ process index and code block index from module 226, trains the received data and searches for codebook index. The compressed data is then forwarded to HARQ buffer 229 with codebook index for the data. On the other hand, if this is a retransmission of data (e.g., Tx m-th), HARQ combination module 227 outputs data to VQ 225 for data compression. For HARQ combination, the HARQ Buffer 229 sends the compressed data to de-VQ module 228 so that it can be de-compressed and used in HARQ combination module 227.

In addition to the HARQ combination, Turbo MIMO combination is depicted as an inner loop with loop index N. If N=0, then de-rate matching module 224 outputs data to HARQ combination module 227, and de-VQ 228 outputs de-compressed data to Turbo decoder 233. On the other hand, if N>1, then de-rate matching module 224 outputs data to Turbo MIMO buffer 231, which forwards data to turbo combination module 230. Further, when N>0, turbo combination module 230 combines de-compressed data from de-VQ 228 with the data from Turbo MIMO buffer 231. Turbo combination module 230 then forwards the combined data to turbo decoder 233 for data decoding.

In accordance to embodiments of the invention, VQ 225 can use modified Lloyd algorithm to reduce the amount of HARQ buffer size required. In other embodiments of the invention, VQ 225 can train codebook and search index in a predefined subset instead of doing a complete set search. Such steps increase the efficiency of VQ 225. Details of these methods are now illustrated below.

Vector Quantization (VQ) is an efficient data compressing method based on the principal of block coding. A VQ maps k-dimensional vectors in the vector space into a finite set of vector called a codeword. The set of all the codeword is a codebook. The VQ takes the source data vector and associates it with a codeword that is the nearest neighbor. The source data is mapped into index based on the codebook during data compression or encoding. The stored indices are subsequently used to map to codeword in the codebook to de-compress the data or decoding.

In general, for MMI based VQ for LLR, the quantization criterion is to maximize the mutual information between original bits and the quantized LLR:

$$\Delta I = H\left(\frac{X}{Y}\right) - H\left(\frac{X}{L}\right)$$

$$X = [x_1, \ldots, x_k]$$

$$Y = [y_1, \ldots, y_k]$$

$$L = [l_1, \ldots, l_k]$$

where
X is the transmitted bits
L is the LLR of the received bits

Y is the reconstruction value for its LLR L VQ splits the source data into k-dimensional regions $R_i$ with reconstruction value of $Y_i$. The index i is within alphabet I={1, ... N}, where the total number of codebook items N=$2^{K \times b}$ and b is the bit width per LLR soft bit. For example, by setting K=3, and LLR bit width=3 for each LLR soft bit, then the total codebook item number N=$2^{3 \times 3}$=512. The final goal of MMI based VQ is to minimize the mutual information loss $\Delta I$.

Figure 3:
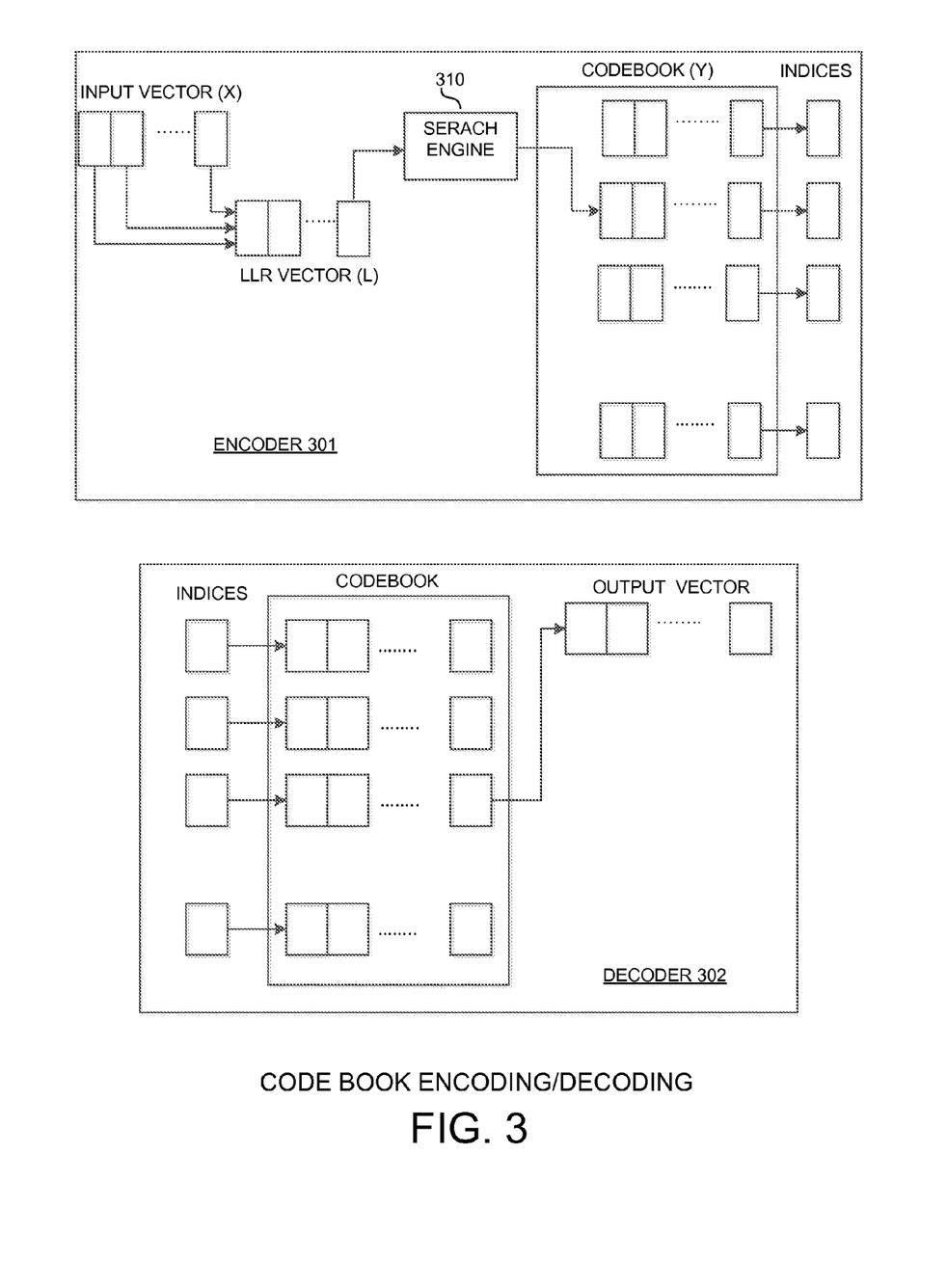
FIG. 3 shows a block diagram of a codebook encoding and decoding function in accordance with embodiments of the invention.

FIG. 3 shows a block diagram of a codebook encoding and decoding function in accordance with embodiments of the invention. In accordance with the general MMI VQ design, encoder 301 receives an input vector from source data vector X=[$x_1, \ldots, x_k$]. The input vector is then encoded by adding soft bits to be represented by its LLR vector L=[$l_1, \ldots, l_k$]. The LLR is then sorted through a search engine 310 in the encoder to find the nearest neighbor in the stored codebook represented by Y=[$y_1, \ldots, y_k$]. Iterations are used to search through and compare the input vector and each codeword in the codebook. A nearest neighbor is found in the codebook depends on different algorithm and criterion that offers the lowest distortion. Once the codeword is identified, a corresponding index associated with the codeword is stored in place the original input vector. For each input vector, Encoder 301 repeats the steps. The input vector is compressed by using indices to represent each input vector.

Upon decoding, Decoder 302 receives the index of the codeword. It then replaces the index with the associated codeword. It is obvious that the larger the codebook is, the more complicated the search and match for the Encoder 301 is required. The larger the codebook, the less distortion results from the data compression. Therefore, the search for codebook index requires faster process. In one embodiment of the invention, the codebook in Encoder 301 and Decoder 302 is further divided into subsets according to certain predefined algorithm. Such algorithm is easily applied to each input vector such that the input vector is directly mapped onto a subset. Subsequently, instead of searching the whole codebook to find the least distortion matching codeword, Encoder Search Engine 310 only need to search the subset of the codebook. Using subset algorithm in VQ encoder greatly increases the efficiency. Further, when a codebook is generated from a sample set of input vector, it is much more efficient to break the input vector into subsets of vectors, train and iterate the vectors in each subset to generate the codebook. The following sections provide detailed steps in accordance to the invention.

Figure 4:
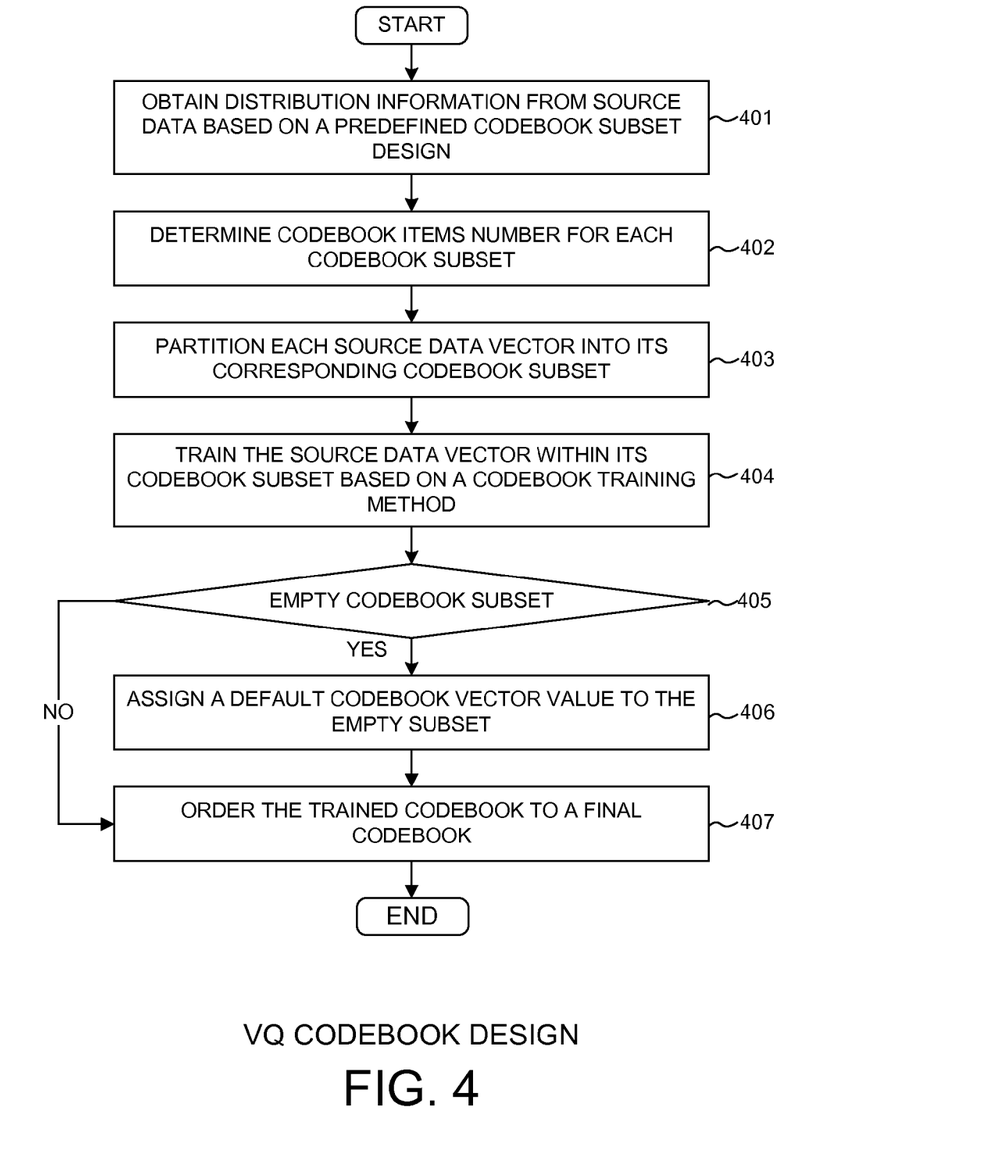
FIG. 4 shows a flow chart in accordance with one embodiment of the invention where the source data is first partitioned into subsets for codebook generation.

FIG. 4 shows a flow chart in accordance with one embodiment of the invention where the source data is first partitioned into subsets for codebook generation. At Step 401, the VQ obtains distribution information from source data based on a predefined codebook subset design. The subset design is predefined. Subsequently, sample source data are counted into each subset according to the algorithm. At Step 402, at the end of the sample source data, based on the total number of codebook items, VQ determines codebook item number $N_S$ for each codebook subset according to the predefined subset algorithm. At Step 403, each source data vector is partitioned into its corresponding codebook subset. At Step 404, VQ trains the source data vector within its codebook subset based on a predefined codebook training method. In one embodiment of the invention, the training method is a modified Lloyd algorithm of MMI VQ. In another embodiment of the invention, the training method is a modified Lloyd algorithm based Euclidean distance VQ. Upon finishing training all the sample vector data, at Step 405, VQ checks if there exists any subset that does not have any codebook codeword associate with it. If there is an empty codebook subset, the algorithm moves on to Step 406 where VQ assigns a default codebook vector value to each of the empty subset. Subsequently, at Step 407, VQ orders the trained codebook to generate a final codebook. If Step 405 does not find any empty codebook subset, VQ directly goes to Step 407 where the final codebook is generated by sorting the trained codebook. Once a codebook is generated based on the subset design and distribution information of the sample data, subsequent VQ encoding can easily use the generated codebook.

Figure 5A:
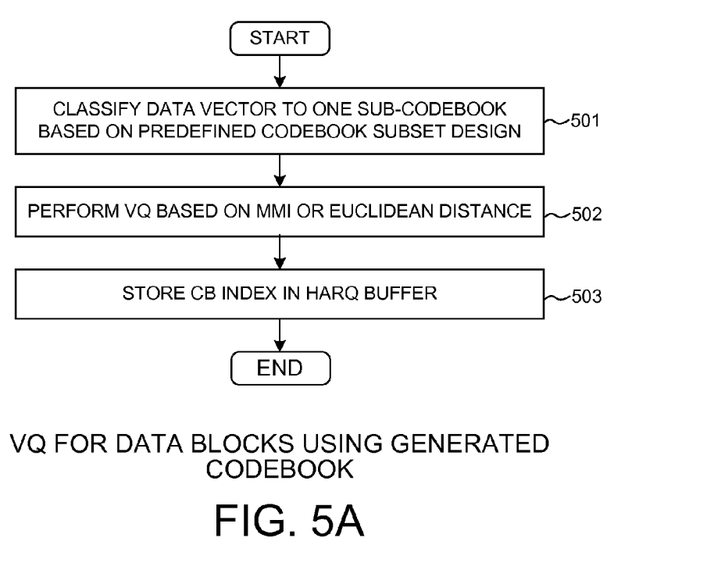
FIG. 5A shows a flow chart in accordance with one embodiment of the invention where each data vector is classified to a sub-codebook based on a predefined codebook subset design.

FIG. 5A shows a flow chart in accordance with one embodiment of the invention where each data vector is classified to a sub-codebook based on a predefined codebook subset design. At Step 501, VQ classifies input data vectors to one of the predefined sub-codebook subset. At Step 502, VQ search for the lowest distortion codeword for the input vector based on a predefined algorithm. In one embodiment of the invention, the predefined algorithm is a modified Lloyd algorithm for MMI VQ. In another embodiment of the invention, the predefined algorithm is a modified Lloyd algorithm for Euclidean distance. Once the nearest neighbor is found with the lowest distortion, the codebook index is returned so that it will replace the actual data vector. At Step 503, the generated codebook index will be stored in the HARQ buffer. The compressed data reduces HARQ memory requirement.

Figure 5B:
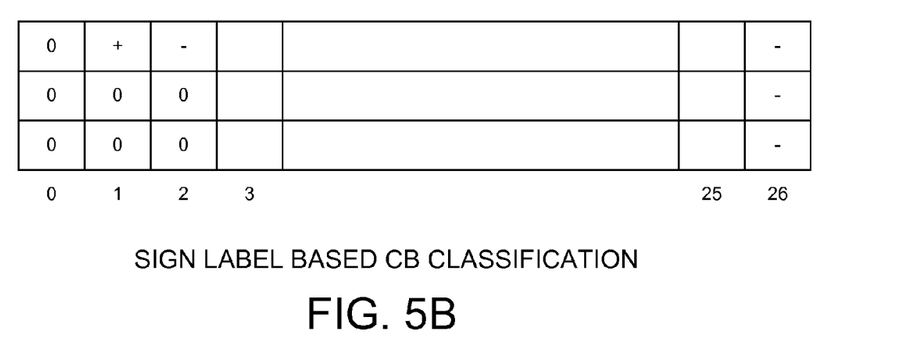
FIG. 5B shows a block diagram of one embodiment of the invention where the LLR sign label is used to divide the code vectors into subsets.

FIG. 5B shows a block diagram of one embodiment of the invention where the LLR sign label is used to divide the code vectors into subsets. LLR has sign label of 0, + and −. Therefore, the algorithm classifies the total codebook into 27 groups. Each group is labeled by sign value of LLRs (0, + or −). When doing data compression, only a subset of codebook in a group with the same sign value is searched. For example, as in FIG. 6, subset 0 contains vectors with LLR sign value of (0, 0, 0), subset 1 contains vectors with LLR sign value of (+, 0, 0), . . . , and subset 26 contains vectors with LLR sign value of (−, −, −). Since each subset contains potentially only one twenty-seventh of codeword, the search can be twenty-seven times more efficient.

Similarly, other method of dividing the source data and codebook into corresponding subsets can be used. Easy and fast method of dividing the subsets will reduce the processing time of searching and thus greatly increase the VQ efficiency. In addition to dividing the source data and codebook into subsets, modified Lloyd algorithm can also increase the efficiency of VQ.

In general, a modified Lloyd algorithm provides better distortion measure and reduces memory requirements. There may be multiple ways to calculate distortion measure, the most common ones are mutual information loss and Euclidean distance.

Figure 6:
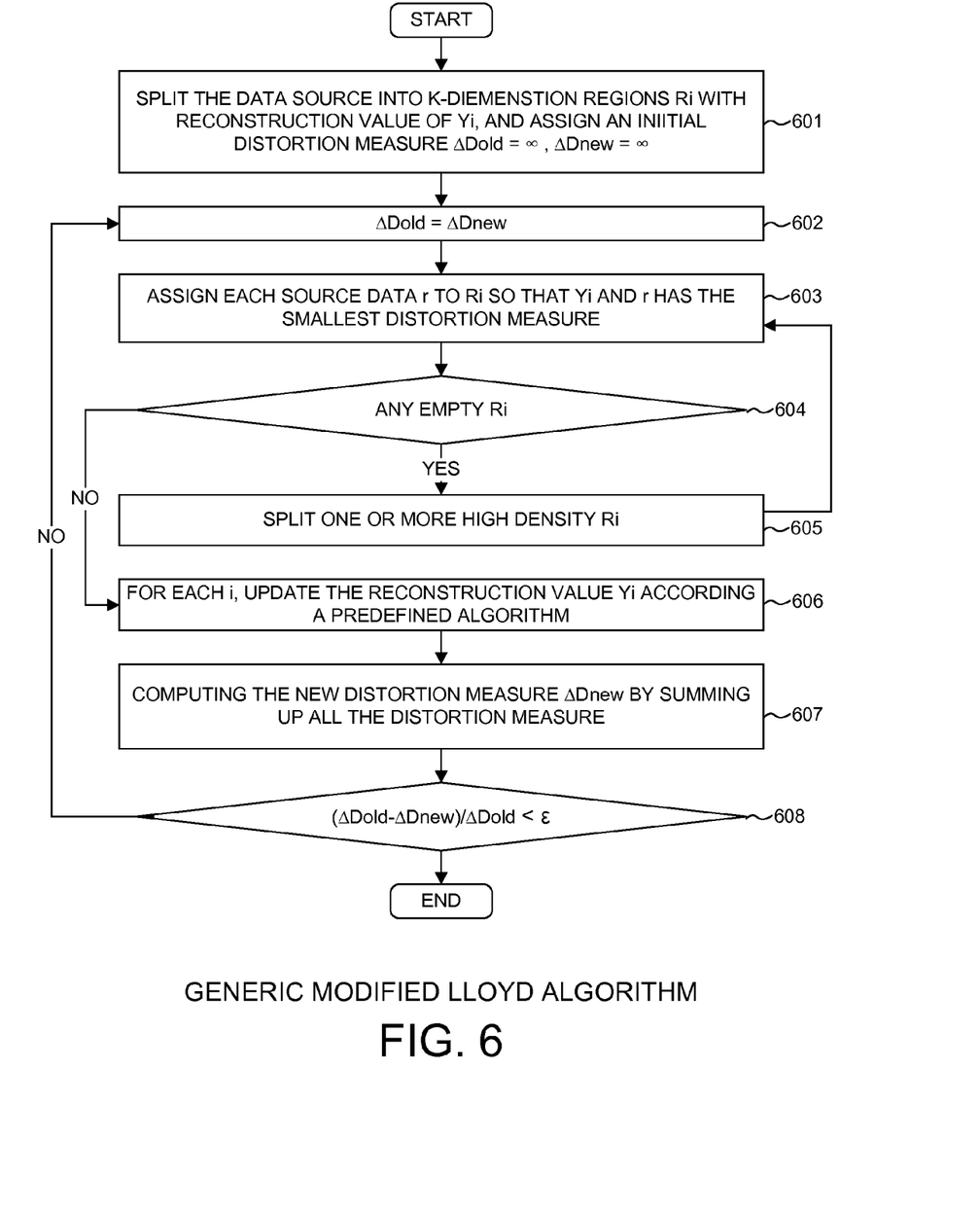
FIG. 6 shows a flow chart in accordance with embodiments of the invention where a generic modified Lloyd algorithm is used.

FIG. 6 shows a flow chart in accordance with embodiments of the invention where a generic modified Lloyd algorithm is used. At Step 601, the VQ splits the source data into k-dimensional regions $R_i$ with reconstruction value of $Y_i$, initializes an old distortion measure $\Delta D_{old}$ and a new distortion measure $\Delta D_{new}$ to be infinite. At Step 602, assigning the new distortion measure equals to the old distortion measure: $\Delta D_{new} = \Delta D_{old}$. At Step 603, for each source data vector r, assigning r to $R_i$ so that $Y_i$ and r has the smallest distortion measure. Moving on to the Step 604, the VQ checks if any region $R_i$ is empty. If there is one or more empty region, at Step 605, the VQ splits one or more high density $R_i$ and goes back to repeat from Step 603. If Step 604 finds no empty region, VQ moves on to Step 606 where for each i, updates the reconstruction value $y_i$, according to a predefined algorithm.

At Step 607, based on the new set of $Y_i$, VQ computes the new distortion measure. At Step 608, VQ checks whether $$\frac{\Delta D_{old} - \Delta D_{new}}{\Delta D_{old}} < \varepsilon,$$

where $\varepsilon$ is a predefined limit. If the condition is not met at Step 608, then the least distortion codeword has not been found yet, and VQ goes back to Step 602 and repeats the steps. If the condition is met Step 608, then the algorithm is completed.

Figure 7:
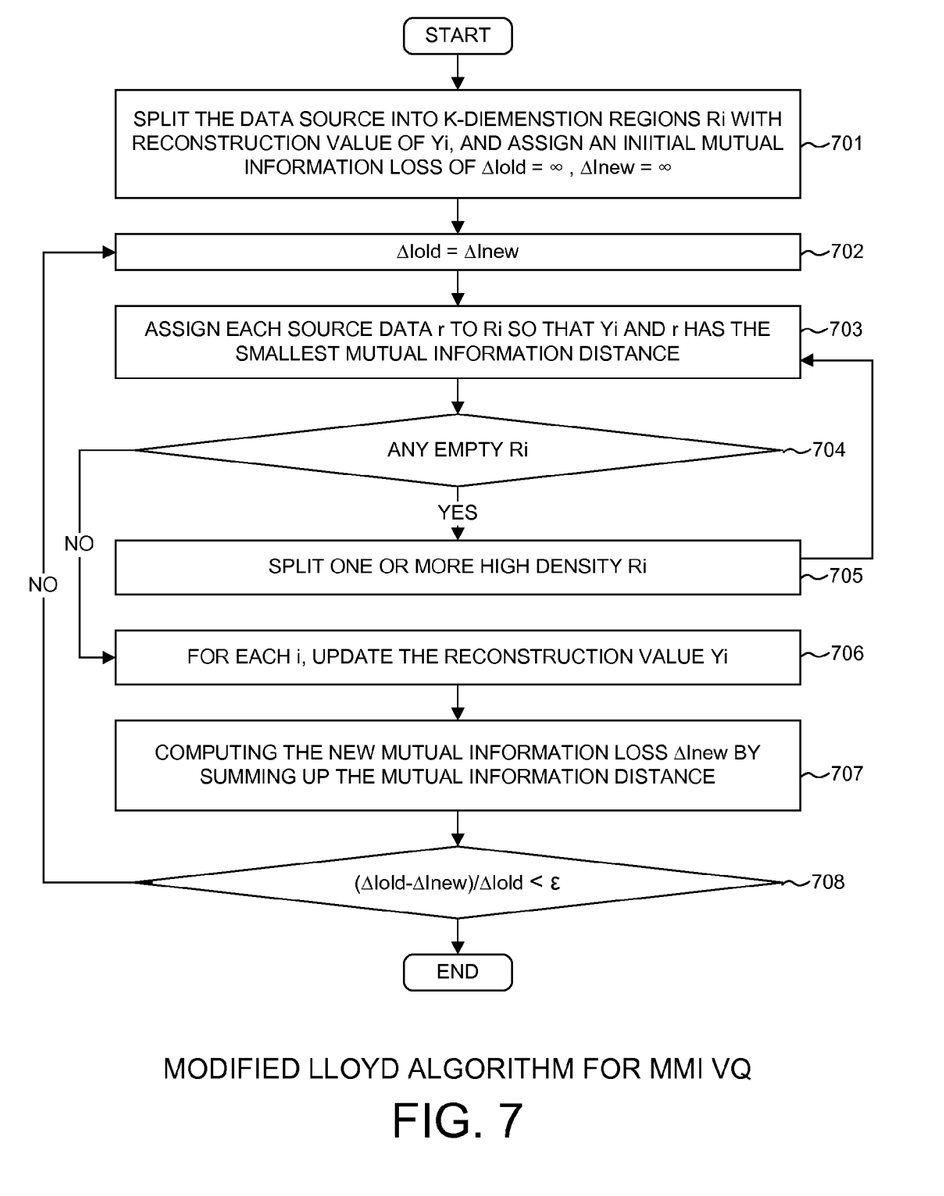
FIG. 7 shows a flow chart in accordance with one embodiment of the invention where a modified Lloyd algorithm is used for MMI VQ.

FIG. 7 shows a flow chart in accordance with one embodiment of the invention where a modified Lloyd algorithm is used for MMI VQ. At Step 701, the VQ splits the source data into k-dimensional regions $R_i$ with reconstruction value of $Y_i$, initializes an old mutual information loss $\Delta I_{old}$ and a new mutual information loss $\Delta I_{new}$ to be infinite. At Step 702, assigning the new mutual information loss equals to the old mutual information loss: $\Delta I_{new} = \Delta I_{old}$. At Step 703, for each source data vector r, assigning r to $R_i$ so that $Y_i$ and r has the smallest mutual information distortion, e.g., $Y_i$=arg min $\tilde{D}(r\|Y_i)$(Yi∈C). Moving on to the Step 704, the VQ checks if any region $R_i$ is empty. If there is one or more empty region, at Step 705, the VQ splits one or more high density $R_i$ and goes back to repeat from Step 703. If Step 704 finds no empty region, VQ moves on to Step 706 where for each i, updates the reconstruction value to:

$$y_{i,k} = \frac{1}{n_i} \sum_{r \in R_i} l_k$$

where
$n_i$ is the number of associated vectors in $R_i$
$l_k$ is a corresponding LLR representation of the source data vector r in $R_i$. After this iteration, a new set of $Y_i$ is generated.

At Step 707, based on the new set of $Y_i$, VQ computes the new mutual information loss $\Delta I_{new} = \Sigma_{r \in \tau} \tilde{D}(r\|Y_i)$, where $\tilde{D}(r\|Y_i)$ is the mutual information distortion between r and $Y_i$. At Step 708, VQ checks whether $$\frac{\Delta I_{old} - \Delta I_{new}}{\Delta I_{old}} < \varepsilon,$$

where $\varepsilon$ is a predefined limit. If the condition is not met at Step 708, then the least distortion codeword has not been found yet, and VQ goes back to Step 702 and repeats the steps. If the condition is met Step 708, then the algorithm is completed. This modified Lloyd algorithm reduces the memory requirement for HARQ and offers less distortion. It is, therefore, much more efficient than the classic ones. Similar algorithm can be used for Euclidean distance VQ.

Figure 8:
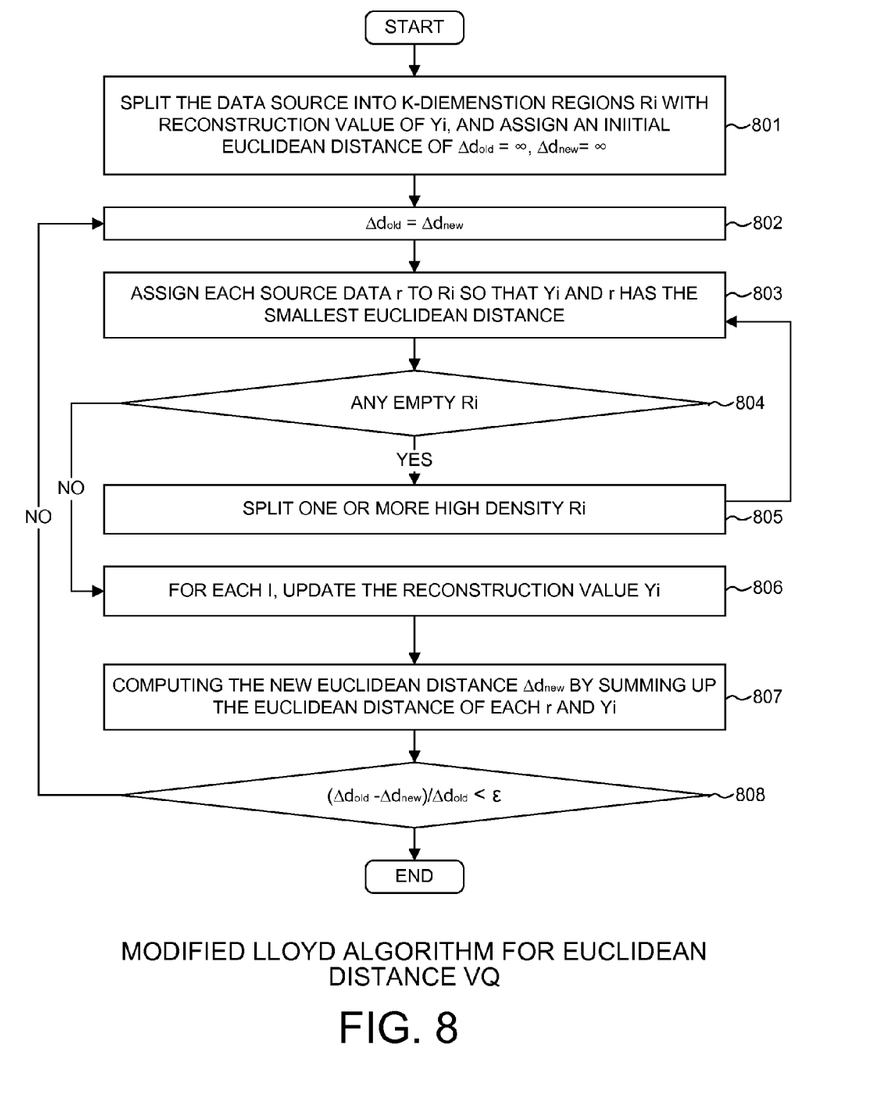
FIG. 8 shows a flow chart in accordance with one embodiment of the invention where a modified Lloyd algorithm is used for Euclidean distance VQ.

FIG. 8 shows a flow chart in accordance with one embodiment of the invention where a modified Lloyd algorithm is used for Euclidean distance VQ. At Step 801, the VQ splits the source data into k-dimensional regions $R_i$ with reconstruction value of $Y_i$, initializes an old mutual information loss $\Delta I_{old}$ and a new mutual information loss $\Delta I_{new}$ to be infinite. At Step 802, assigning the new mutual information loss equals to the old mutual information loss: $\Delta I_{new} = \Delta I_{old}$. At Step 803, for each source data vector r, assigning r to $R_i$ so that $Y_i$ and r has the smallest Euclidean distance, e.g., $Y_i$=arg min$\|r-Y_i\|^2$ (Yi∈C). Moving on to the Step 804, the VQ checks if any region $R_i$ is empty. If there is one or more empty region, at Step 705, the VQ splits one or more high density $R_i$ and goes back to repeat from Step 803. If Step 804 finds no empty region, VQ moves on to Step 806 where for each i, updates the reconstruction value to:

$$y_{i,k} = \frac{1}{n_i} \sum_{r \in R_i} l'_k$$

where $n_i$ is the number of associated vectors in $R_i$ $l_k$ is a corresponding LLR representation of the source data vector r in $R_i$. After this iteration, a new set of $Y_i$ is generated.

At Step 807, based on the new set of $Y_i$, VQ computes the new Euclidean distance $\Delta d_{new} = \Sigma_{r \in \tau} \|r - Y_i\|^2$, where $\|r - Y_i\|^2$ is the Euclidean distance between r and $Y_i$. At Step 808, VQ checks whether $$\frac{\Delta I_{old} - \Delta I_{new}}{\Delta I_{old}} < \varepsilon,$$

where $\varepsilon$ is a predefined limit. If the condition is not met at Step 808, then the least distortion codeword has not been found yet, and VQ goes back to Step 802 and repeats the steps. If the condition is met Step 808, then the algorithm is completed. This modified Lloyd algorithm reduces the memory requirement for HARQ and offers less distortion. It is, therefore, much more efficient than the classic ones.

In accordance with the embodiments of the current invention, VQ can generate codebook more efficiently and reduces the HARQ memory usage. Dividing of codebook and source data into subsets based on predefined algorithm works very well when the data distribution stays about the same for all subsets. The following illustrates the advantage of using such method.

Figure 9A:
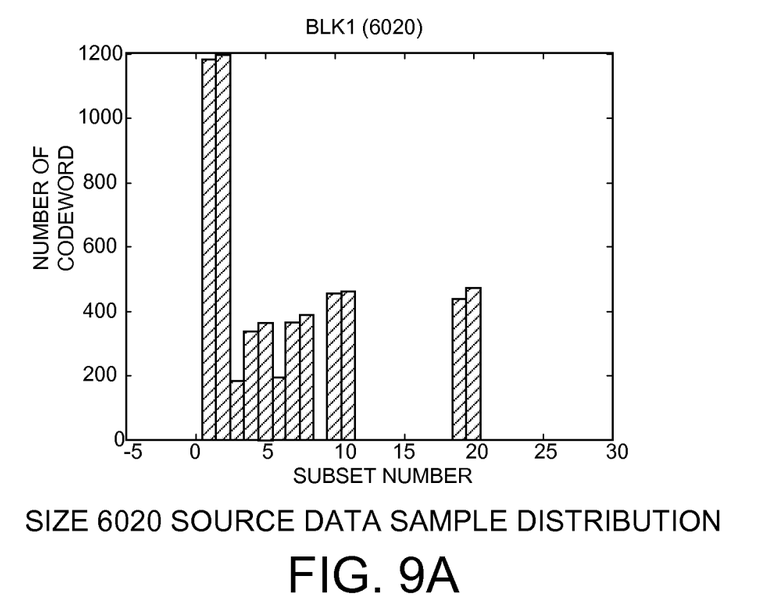
FIG. 9A is a distribution chart showing a sample input source data with size 6020.

FIG. 9A is a distribution chart showing a sample input source data with size 6020. The source data sample is divided into 27 subsets based on their LLR sign values. FIG. 9A shows that there are close to 1200 code vectors in subsets 1 and 2, while there is no data in many other subsets such as subsets 12 through 18. This sample data distribution information is the first step to determine how to generate a codebook that mirrors any similar data distribution.

Figure 9B:
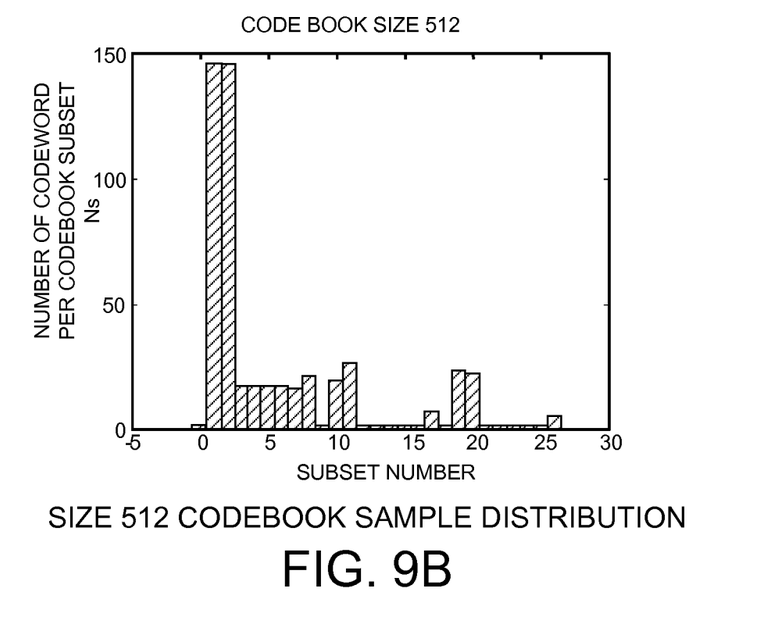
FIG. 9B is a distribution chart showing a size 512 sample codebook generated from FIG. 9A source code vector.

FIG. 9B is a distribution chart showing a size 512 sample codebook generated from the source code vector of FIG. 9A. Here, a total of 512-codeword codebook is generated according to the distribution information as shown in FIG. 9A. In subsets 1 and 2, where it has the most populous source data, there are the highest number of codeword in it. For the subsets that do not have any source data in it, a default codeword is still assigned for that subset. For example, subsets 12 through 18, each has a codeword even though there is no source data in the sample data.

It is clear from FIGS. 9A and 9B that the search can be dramatically reduced following the embodiments of the invention. For example, for source data falls in the most populous subsets 1 or 2, VQ only needs to search through less than 150 codeword to find a match. This is much less than the 512 total codeword for the codebook and it is the largest set. For source data in subset 20, VQ only needs to search less than 40 codeword. Such design dramatically increases the efficiency. It is worth noticing that if the distribution pattern changes dramatically from one set of data to another set, then it is optimal that a new set of codebook is generated and used to achieve the optimum results. Such implementation requires dynamically updating the codebook. Alternatively, each HARQ may use different codebook according to its own data distribution.

The modified Lloyd algorithm described above can be used together with codebook subset to increase the efficiency. It can also be use independently with tradition codebook search without dividing the codebook and source data into subsets. Further, GLA or other optimized VQ algorithm can be used in lieu of the method of dividing the codebook and source data into subsets.

Although the present invention has been described in connection with certain specific embodiments for instructional purposes, the present invention is not limited thereto. Accordingly, various modifications, adaptations, and combinations of various features of the described embodiments can be practiced without departing from the scope of the invention as set forth in the claims.

What is claimed is:

1. A method, comprising:

obtaining distribution information from a set of source data vectors based on a predefined codebook subset design;

determining a codebook item number $N_S$ for each codebook subset based on a predefined codebook length L and the distribution information;

partitioning each source data vector into its corresponding codebook subset;

training the source data vector within its codebook subset; and assigning a default codebook vector value to any codebook subset that does not have any source data vector in it.

2. The method of claim 1 further comprising:

ordering the trained codebook of each subset to a final codebook with length L.

3. The method of claim 1, wherein the source data vectors are log-likelihood ratio (LLR) vectors, and wherein the predefined codebook subset design is based on sign labels of the LLR vectors.

4. The method of claim 3, wherein the codebook training method for each subset involves applying a modified Lloyd algorithm for Vector Quantization (VQ).

5. The method of claim 4, wherein the VQ is based on Maximum Mutual Information (MMI), and wherein the training comprising the steps of:

a) splitting the source data into k-dimensional regions $R_i$ with reconstruction value of $Y_i$, and initializing an old mutual information loss $\Delta I_{old}$ and a new mutual information loss $\Delta I_{new}$ to be infinite;

b) assigning the new mutual information loss $\Delta I_{new} = \Delta I_{old}$;

c) for each source data vector r, assigning r to $R_i$ so that $Y_i$ and r has the smallest mutual information distortion;

d) if any region $R_i$ is empty, splitting one or more high density $R_i$ and repeat step c);

e) for each i, updating the reconstruction value to $$y_{i,k} = \frac{1}{n_i} \sum_{r \in R_i} l'_k$$

vectors in $n_i$ and $l_k$ is a corresponding LLR representation of the source data r in $R_i$;

f) computing the new mutual information loss $\Delta I_{new} = \Sigma_{r \in \tau} \tilde{D}(r\|Y_i)$, where $\tilde{D}(r\|Y_i)$ is the mutual information distortion between r and $Y_i$; and g) repeating steps b) to f) until $$\frac{\Delta I_{old} - \Delta I_{new}}{\Delta I_{old}} < \varepsilon,$$

where $\varepsilon$ is a predefined limit.

6. The method of claim 4, wherein the VQ is based on Euclidean distance, and wherein the training comprising the steps of:
   a) splitting the subset into k-dimensional regions $R_i$ with reconstruction value of $Y_i$ and initializing an old Euclidean distance $\Delta d_{old}$ and a new Euclidean distance $\Delta d_{new}$ to be infinite;
   b) assigning the new Euclidean distance $\Delta d_{new} = \Delta d_{old}$;
   c) for each source data vector r assigning r to a $R_i$ so that $Y_i$ and r has the smallest Euclidean distance;
   d) if any region $R_i$ is empty, splitting one or more high density $R_i$ and repeat step c);
   e) for each i, updating the reconstruction value to $$y_{i,k} = \frac{1}{n_i} \sum_{r \in R_i} l'_k$$

where $n_i$ is the number of associated vectors in $R_i$, and $l_k$ is a corresponding LLR representation of the source data vector r in $R_i$;
   f) computing the new Euclidean distance $\Delta d_{new} = \Sigma_{r \in \Sigma} \|r - Y_i\|^2$, where $\|r - Y_i\|^2$ is the Euclidean distance between r and $Y_i$;
   g) repeating steps b) to f) until $$\frac{\Delta d_{old} - \Delta d_{new}}{\Delta d_{old}} < \varepsilon,$$

where $\varepsilon$ is a predefined limit.

7. The method in claim 1 further comprising:
generating a set of codebook index for the source data vector and storing it in a HARQ buffer.

8. A device, comprising:
a distribution information module that obtains distribution information from a set of source data vectors based on a predefined codebook subset design;
a codebook subset module that determines a codebook item number $N_S$ for each codebook subset based on a predefined codebook length L and the distribution information;
a partitioning module that partitions each source data vector into its corresponding codebook subset;
a training module that trains the source data vector within its codebook subset; and
an assigning module that assigns a default codebook vector value to any codebook subset that does not have any source data vector in it.

9. The device of claim 8, further comprising:
an ordering module that orders the trained codebook of each subset to a final codebook with length L.

10. The device of claim 8, wherein the source data vectors are log-likelihood ratio (LLR) vectors, and wherein the predefined codebook subset design is based on sign labels of the LLR vectors.

11. The device of claim 8, wherein the codebook training method for each subset involves applying a modified Lloyd algorithm for Vector Quantization (VQ) for log-likelihood ratio (LLR) vectors.

12. The device of claim 11, wherein the VQ is based on Maximum Mutual Information (MMI), and wherein the modified Lloyd algorithm searches for quantized LLR to minimize mutual information loss.

13. The device of claim 11, wherein the VQ is for Euclidean distance, and wherein the modified Lloyd algorithm searches for quantized LLR to minimize Euclidean distance.

14. The device of claim 8, further comprising:
an index module that generates a set of codebook index for the source data vector and storing it in a HARQ buffer.

15. A codebook training method of applying a modified Lloyd algorithm for Vector Quantization, the method comprising:
   a) splitting a set of source data into k-dimensional regions $R_i$ with reconstruction value of $Y_i$ and initializing an old distortion measure $\Delta D_{old}$ and a new distortion measure $\Delta D_{new}$ to be infinite;
   b) assigning the new distortion measure $\Delta D_{new} = \Delta D_{old}$;
   c) for each source data vector r, assigning r to a $R_i$ so that $Y_i$ and r has the smallest distortion measure;
   d) if any region $R_i$ is empty, splitting one or more high density $R_i$ and repeat step c);
   e) for each $R_i$, updating the reconstruction value $Y_i$ according to a predefined algorithm;
   f) computing the new distortion $\Delta D_{new}$ based on the updated reconstruction value $Y_i$; and
   g) repeating steps b) to f) until $$\frac{\Delta D_{old} - \Delta D_{new}}{\Delta D_{old}} < \varepsilon,$$

where $\varepsilon$ is a predefined limit.

16. The method of claim 15, wherein the modified Lloyd algorithm is for Maximum Mutual Information (MMI) VQ, and wherein the distortion measure is a mutual information loss.

17. The method of claim 15, wherein the modified Lloyd algorithm is for Euclidean distance VQ, and wherein the distortion measure is a Euclidean distance.

18. The method of claim 15, wherein the predefined updating algorithm in step e) involves assigning $$y_{i,k} = \frac{1}{n_i} \sum_{r \in R_i} l'_k$$

where $n_i$ is the number of associated vectors in $R_i$, and $l_k$ is a corresponding LLR representation of the source data vector r in $R_i$.

19. The method of claim 18, wherein the distortion measure is a mutual information loss, and wherein $\Delta D_{new} = \Sigma_{r \in \tau} \tilde{D}(r\|Y_i)$ where $\tilde{D}(r\|Y_i)$ is the mutual information distortion between r and $Y_i$.

20. The method of claim 18, wherein the distortion measure is a Euclidean distance, and wherein $\Delta D_{new} = \Sigma_{r \in \tau} \|r - Y_i\|^2$, where $\|r - Y_i\|^2$ is the Euclidean distance between r and $Y_i$.

* * * * *

UNITED STATES PATENT AND TRADEMARK OFFICE
CERTIFICATE OF CORRECTION

PATENT NO.       : 8,749,408 B1  
APPLICATION NO.  : 13/729016  
DATED            : June 10, 2014  
INVENTOR(S)      : Junqiang Li Page 1 of 1

It is certified that error appears in the above-identified patent and that said Letters Patent is hereby corrected as shown below:

IN THE CLAIMS:

Column 10, line 60, after "$y_{i,k} = \frac{1}{n_i} \Sigma_{r \in R_i} l_k$" insert -- where $n_i$ is the number of associated --.

Column 10, line 63, the word "$n_i$" should be changed to -- $R_i$ --.

The text of column 10, lines 56-64 should now read:

e) for each $i$, updating the reconstruction value to $y_{i,k} = \frac{1}{n_i} \Sigma_{r \in R_i} l_k$, where $n_i$ is the number or associated vectors in $R_i$ and $l_k$ is a corresponding LLR representation of the source data r in $R_i$.

Signed and Sealed this
Eighteenth Day of November, 2014

Michelle K. Lee
*Deputy Director of the United States Patent and Trademark Office*